United States Patent
Tsuji et al.

(10) Patent No.: US 6,404,066 B1
(45) Date of Patent: Jun. 11, 2002

(54) SEMICONDUCTOR DEVICE AND PROCESS FOR MANUFACTURING THE SAME

(75) Inventors: Masahiro Tsuji; Tsunemori Yamaguchi, both of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 13 days.

(21) Appl. No.: 09/644,572

(22) Filed: Aug. 24, 2000

(30) Foreign Application Priority Data

Aug. 24, 1999 (JP) ............................................. 11-236965

(51) Int. Cl.⁷ ......................... H01L 23/48; H01L 23/52; H01L 29/40
(52) U.S. Cl. ...................... 257/783; 257/782; 257/677; 257/666
(58) Field of Search ................................ 257/783, 782, 257/666, 676, 677

(56) References Cited

U.S. PATENT DOCUMENTS

| | | | | |
|---|---|---|---|---|
| 4,942,454 A | * | 7/1990 | Mori et al. | |
| 5,252,855 A | * | 10/1993 | Ogawa et al. | |
| 5,424,578 A | * | 6/1995 | Fujita et al. | |
| 5,859,471 A | * | 1/1999 | Kuraishi et al. | |
| 6,034,422 A | * | 3/2000 | Horita et al. | |
| 6,252,299 B1 | * | 6/2001 | Masuda et al. | |
| 6,303,981 B1 | * | 10/2001 | Moden | |
| 6,310,390 B1 | * | 10/2001 | Moden | |

FOREIGN PATENT DOCUMENTS

JP      2-86157     *    3/1990

* cited by examiner

Primary Examiner—Sheila V. Clark
(74) Attorney, Agent, or Firm—Sughrue Mion, PLLC

(57) ABSTRACT

A semiconductor chip is bonded with a polyimide bonding agent to a lead frame of a copper alloy which has been plated with copper. The electrode of the semiconductor chip is connected to each terminal of the lead frame with a wire mainly comprising gold or copper and bonded portions between the semiconductor chip and the wires and between the lead frame and the wires are sealed with a resin. Thus, a semiconductor device can be manufactured.

1 Claim, 3 Drawing Sheets

SEMICONDUCTOR DEVICE AND PROCESS FOR MANUFACTURING THE SAME

BACKGROUND OF THE INVENTION

1. Field of the Invention

The present invention relates to a semiconductor device and in particular to a semiconductor device and a process for manufacturing the same using a polyimide bonding agent (paste) to bond a semiconductor chip on a lead frame made of a copper alloy.

2. Description of the Related Art

The semiconductor device comprises a semiconductor chip 4 which is bonded on a die pad 1a of a lead frame with a bonding agent 3 such as Ag paste as shown in FIG. 1. Each electrode pad 6 of the semiconductor chip 4 is connected to an inner lead 2 of each terminal of the lead frame through a gold wire. The semiconductor device is of structure in that the above-mentioned elements are sealed with a sealing resin. A part of each inner lead of the lead frame (represented with hatching) is plated with Ag so that the inner lead can be connected to a gold wire 5 in an atmosphere.

If the package for the device is very small in size or the die pad is very large in comparison with the package, only a design in which the inner leads are short would be made possible. Plating of the inner lead with Ag in such a condition will cause a problem in that plating material which is Ag may leak out from the package beyond the inner leads.

FIG. 2 is a schematic view showing a part of one of the inner leads 2 shown in FIG. 1 in a enlarged scale. A reference P in the drawing denotes a package line. If the lead frame having a small plating area as shown in the drawing is plated, leakage of the plating material out from the package beyond the maximum value of the plating area would be inevitable.

Leakage of the Ag plating out from the package may cause serious problems relating to reliability, such as migration M of as shown in FIG. 3 and deterioration in reliability on humidity resistance.

For the above-mentioned reasons, it is very hard to plate a part of the inner lead 2 of the lead frame with Ag if the package is very small in size or the die pad is very large in comparison with the package. It is common to conduct Cu plating in lieu of Ag plating.

Then, the lead frame which has been plated with Cu will be considered. If the lead is made of, for example, an iron alloy such as 42 Ni, a gold film having a thickness of about 15000 to 30000 Å is deposited on the reverse side of the semiconductor chip and the chip is heated up to about 450 to 550° C. in a reduced atmosphere, so that the semiconductor chip is directly bonded on a die pad of the lead frame with gold, or with Au—Si. Subsequently, the electrode pad of the semiconductor chip is connected to the inner leads of the lead frame at about 300° C. in a reduced atmosphere with wires mainly consisting of gold or copper. The semiconductor chip, wires, and inner leads of the lead frame are sealed with a resin. Thus, a semiconductor device is manufactured.

If the lead frame which is plated with copper is made of an iron alloy, gold is vacuum deposited on the reverse side of the chip to a thickness of about 15000 to 30000 Å. Bonding between the semiconductor chip and the lead frame is possible by either direct bonding using gold or bonding using an Au—Si preform.

However, if the lead frame which is plated with copper is made of a copper alloy, direct bonding or Au—Si die bonding may cause cracks to occur in the semiconductor chip due to thermal expansion and contraction in associated with changes in temperature on bonding between the semiconductor chip and the lead frame since they have different thermal expansion coefficients. Accordingly, the semiconductor device can not be produced by this method.

When the copper frame is bond to the semiconductor chip, commonly used epoxy resin Ag paste is cured at about 150° C. to 200° C. and then wire bonding is carried out at about 200° C. to 250° C. Since this semiconductor device has the inner leads of the lead frame which are not plated with Ag, it is necessary to conduct reduction for removing an oxide film from the lead frame surface.

In order to reduce the oxide film in a short period of time, it is necessary to heat it above 300° C. However, heating of the epoxy resin Ag paste above 300° C. will cause the pyrolysis of the resin so that the reliability on the bonding between the semiconductor chip and the lead frame will remarkably lower. If the temperature of the lead frame is suppressed to be lower than 300° C. in order to prevent the pyrolysis of the resin, the reliability on the bonding between the inner leads of the lead frame and gold wires would largely lower. In either case, a process for manufacturing the semiconductor device including a lead frame made of a copper alloy in which its reliability is assured enough has not been established.

It is an object of the present invention to provide a semiconductor device including a copper alloy lead frame in which its reliability which is higher than that including the iron alloy lead frame is assured and a process for manufacturing the same at a low cost.

SUMMARY OF THE INVENTION

In order to accomplish the above-mentioned object, the present invention provides a semiconductor device comprising a semiconductor chip which is bonded with a polyimide bonding agent to a lead frame of a copper alloy which has been plated with copper, in which the electrode of the semiconductor chip is connected to each terminal of the lead frame with a wire mainly comprising gold or copper and in which bonded portions between the semiconductor chip and the wires and between the lead frame and the wires are sealed with a resin.

The invention resides in a process for manufacturing a semiconductor device comprising the steps of applying a polyimide paste on a lead frame of a copper alloy, which has been plated with copper to mount a semiconductor chip on the lead frame, curing said polyimide paste by heating it while maintaining an pressure-reduced atmosphere by evacuation thereof, then conducting wire bonding between the electrode of the semiconductor chip and each terminal of the lead frame in a reducing atmosphere.

The invention resides in a process for manufacturing a semiconductor device comprising the steps of applying a polyimide paste on a lead frame of a copper alloy, which has been plated with copper to mount a semiconductor chip on the lead frame, curing said polyimide paste by heating it at about 300° C. for about 60 minutes while maintaining an pressure-reduced atmosphere at $10^1$ through $10^2$ Torr by evacuation thereof, then conducting wire bonding between the electrode of the semiconductor chip and each terminal of the lead frame while reducing in a forming gas of about 300° C. to 450° C.

The invention resides in a method of manufacturing a semiconductor device as defined in the preceding paragraph in which said forming gas comprises about 5 to 10% of $H_2$ and the rest of $N_2$.

According to the invention, a semiconductor device having a reliability which is higher than that including iron alloy lead frame can be readily obtained by using a lead frame made of a copper alloy which has not been plated with silver but plated with copper since the polyimnide bonding agent can be used, and since the oxidation of copper can be prevented, a semiconductor device can be manufactured by conducting packaging of the semiconductor chip using a lead frame which has not been plated with silver, that is, a lead frame made of a copper alloy which has been plated with copper.

DESCRIPTION OF THE PREFERRED EMBODIMENTS

Polyimide bonding agent has an elastic modulus which is about 1/20 of that of Au—Si and is resistant to the high temperature of 450° C. for about several minutes. The present invention takes note on this characteristics of the polyimide bonding agent and uses it as an agent for bonding between the lead frame made of an copper alloy and the semiconductor chip.

In other words, since the lead frame made of a copper alloy of the present invention can not be plated with silver at its bonding area as mentioned above, it is plated with copper. The bonding area of the lead frame should be alloyed by directly applying thereto gold or copper wire. Wire bonding on the lead frame will promote oxidation of copper due to heat. Accordingly, wire bonding can not be conducted without any special treatment.

Therefore, wire bonding is conducted while the oxide in the copper lead frame is reduced in a forming gas. In accordance with the present invention, the lead frame made of a copper alloy is bonded to a semiconductor chip with a polyimide bonding agent and then copper oxide is reduced in a forming gas and wire bonding is conducted in the forming gas.

Practical Example

A process for manufacturing the semiconductor device of the present invention will be described with reference to FIG. 4.

Figure 4A:
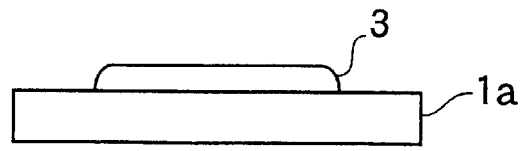
FIGS. 4A and 4B are a view explaining a method of manufacturing the semiconductor device of the present invention.
Figure 4B:
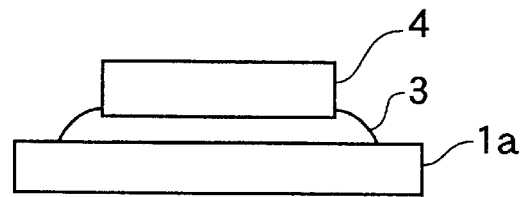

Firstly, a polyimide paste 3 is applied on a die pad 1a of a lead frame 1 made of a copper alloy which has been plated with copper by a potting method (FIG. 4A). A semiconductor chip 4 is mounted on the lead frame 1 (FIG. 4B).

Subsequently, an assembly of the lead frame 1 and the semiconductor chip 4 which are bonded using the polyimide paste 3 is heated at about 120° C. for about 60 minutes in a vacuum oven which is maintained at about $10^{-1}$ to $10^{-2}$ Torr for eliminating a solvent (for example, N-methylpyrrolidone) in the polyimide paste. After the elimination of the solvent, the assembly is heated at about 300° C. for about 60 minutes for completely curing the polyimide paste.

During the above-mentioned heating steps, the vacuum oven is constantly evacuated to prevent the oxidation of the copper frame and to prevent the out gas generated from the curing paste from being deposited on the copper frame and chip.

Figure 5A:
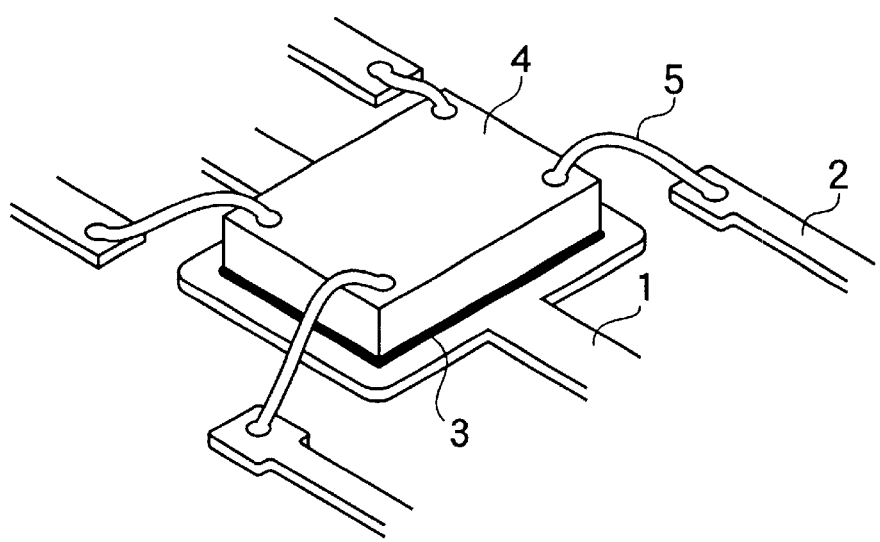
FIG. 5A is a perspective view showing the semiconductor device of the present invention.
Figure 5B:
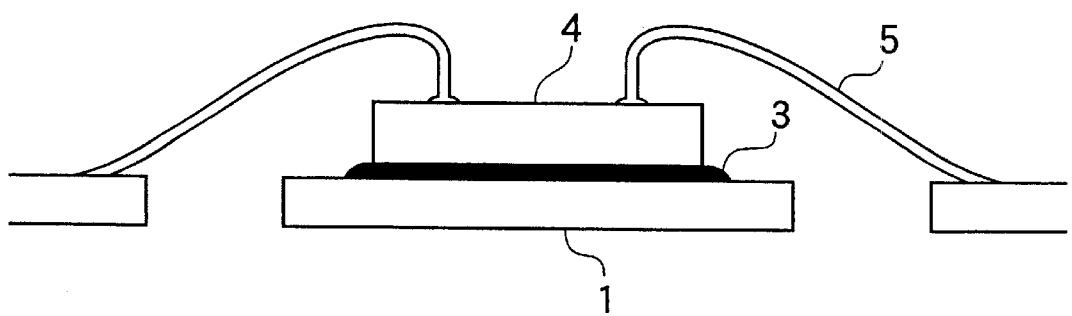
FIG. 5B is an elevational view showing the semiconductor device of the present invention.

After the complete curing of the polyimide paste, wire bonding is conducted by directly applying a gold wire 5 on the surface of plated copper for alloying thereof as shown in perspective and elevational views of FIGS. 5A and 5B, respectively. Since the polyimide bonding agent is sufficiently resistant to the high temperature of 450° C. for several minutes, this process is conducted while preventing the oxidation of the copper in a forming gas comprising 5 to 10% of $H_2$ and the rest of $N_2$ at 300 to 450° C.

Meanwhile, since the silver paste is thermally decomposed at about 300° C., carrying out of the wire bonding process is impossible and the silver paste can not be used.

Figure 1:
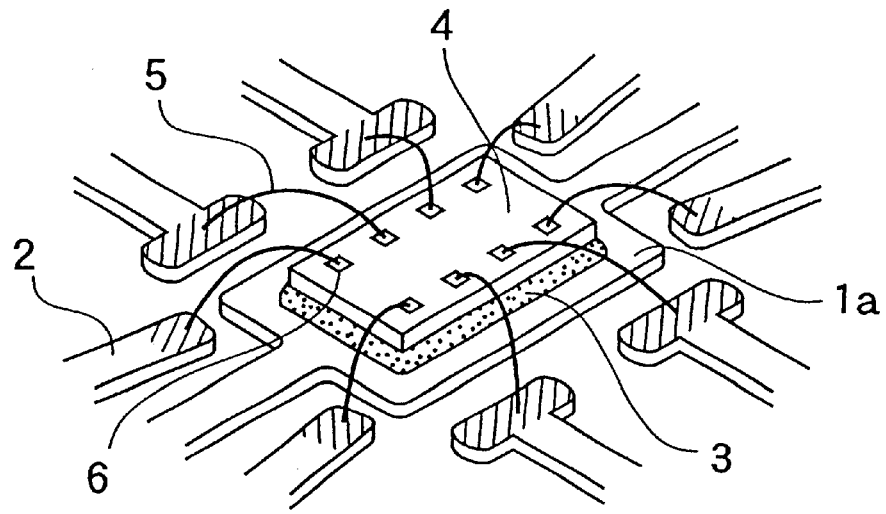
FIG. 1 is a perspective view explaining a prior art semiconductor device.
Figure 2:
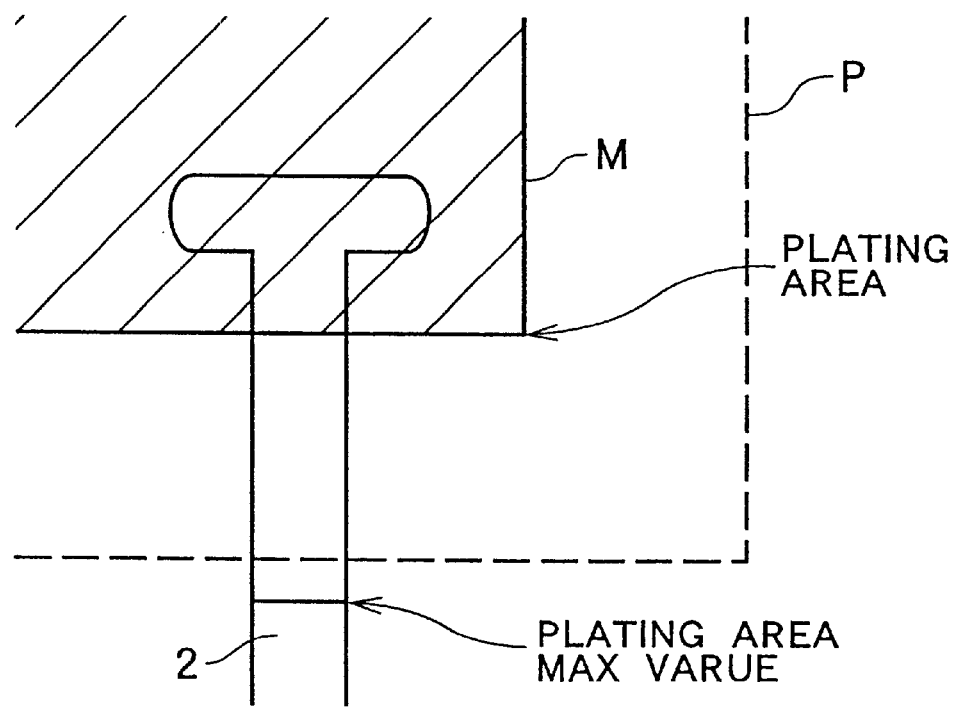
FIG. 2 is a partly enlarged view of FIG. 1.
Figure 3:
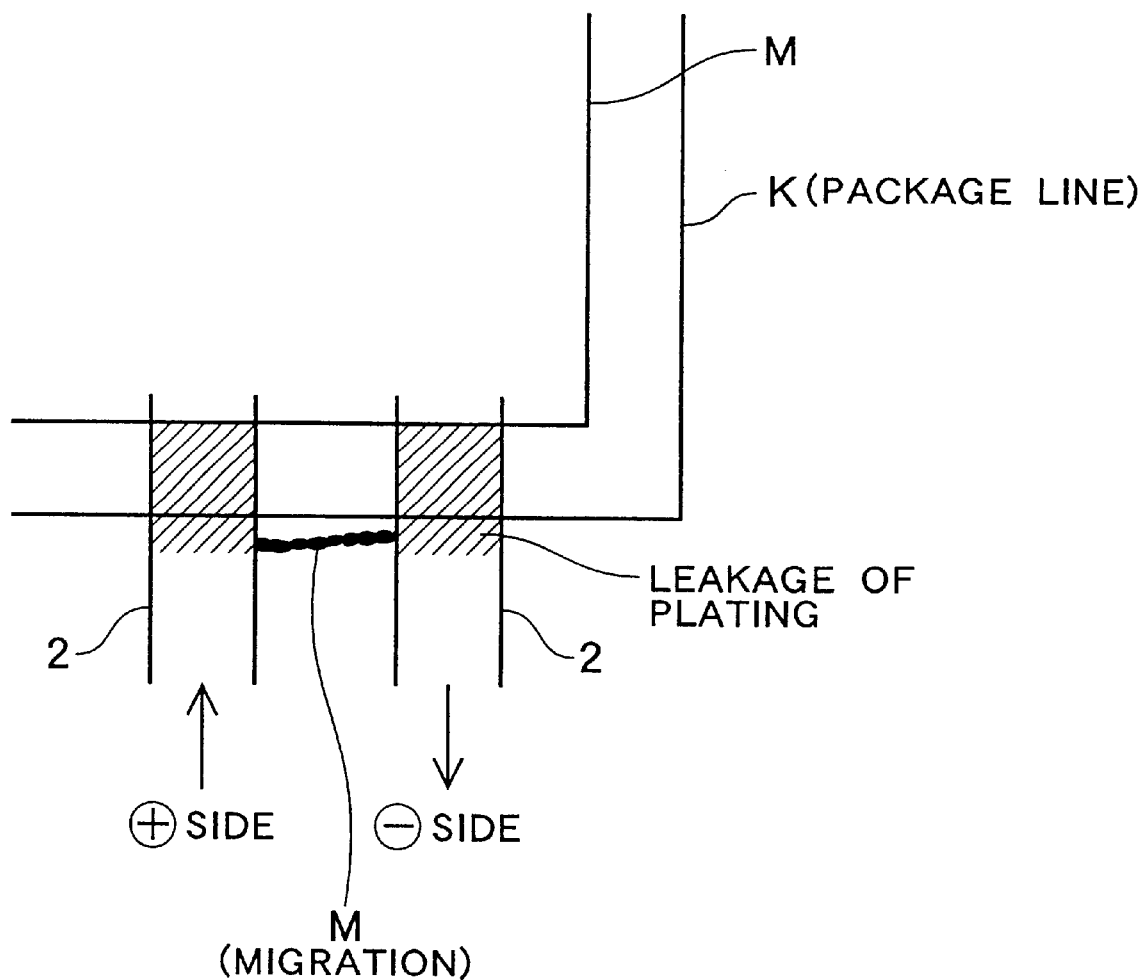
FIG. 3 is a schematic view explaining the migration of silver occurring between the leads.

Since the polyimide bonding agent has an elastic modulus which is about 1/20 of that of Au—Si, no chip cracks occur although the difference between the thermal expansion coefficients of the lead frame and semiconductor chip is large. Since the polyimide bonding agent 3 is resistant to the reduction at a high temperature of 450° C., use of the polyimide bonding agent 3 allows the wire (gold wire) 5 to be bonded on the lead frame made of a copper alloy which has been copper plated. The lead frame 1, semiconductor chip 4, gold wire 5 and a part of the inner lead 2 of the thus manufactured semiconductor device are sealed with a resin in a package line similarly with the prior art semiconductor device shown in, for example, FIG. 1 so that a package can be manufactured.

What is claimed is:

1. A semiconductor device comprising a semiconductor chip which is bonded with a polyimide bonding agent to a lead frame of a copper alloy which has been plated with copper, in which the electrode of the semiconductor chip is connected to each terminal of the lead frame with a wire mainly comprising gold or copper and in which bonded portions between the semiconductor chip and the wires and between the lead frame and the wires are sealed with a resin.

* * * * *